United States Patent [19]

Matsuda et al.

[11] Patent Number: 5,834,796
[45] Date of Patent: Nov. 10, 1998

[54] AMORPHOUS SILICON THIN FILM TRANSISTOR AND METHOD OF PREPARING SAME

[75] Inventors: Akihisa Matsuda, Tsuchiura; Michio Kondo, Tsukuba; Yoshihiko Chida, Matsusaka, all of Japan

[73] Assignees: Central Glass Company, Limited, Yamaguchi; Agency of Industrial Science and Technology, Tokyo, both of Japan

[21] Appl. No.: 653,565

[22] Filed: May 24, 1996

[30] Foreign Application Priority Data

May 25, 1995 [JP] Japan ................................. 7-126091

[51] Int. Cl.⁶ .................................................. H01L 29/04
[52] U.S. Cl. ................................. 257/57; 257/66
[58] Field of Search ................................. 257/57, 65, 66

[56] References Cited

U.S. PATENT DOCUMENTS 5,340,999  8/1994  Takeda et al. ........................... 257/66

FOREIGN PATENT DOCUMENTS

| 0 473 988 | 3/1992 | European Pat. Off. . |
| 61-59873 | 3/1986 | Japan . |
| 61-65477 | 4/1986 | Japan . |
| 5-50865 | 6/1986 | Japan . |
| 2-47633 | 2/1990 | Japan . |
| 3-23679 | 1/1991 | Japan . |
| 5-304171 | 11/1993 | Japan . |
| 06-97444 | 4/1994 | Japan . |

OTHER PUBLICATIONS

Abstract of JP 59–213169, Dec. 3, 1984, Patent Abstracts of Japan, vol. 009, No. 081 (E–307) Apr. 10, 1985.
Abstract of JP 61–005578, Jan. 11, 1986, Patent Abstracts of Japan, vol. 010, No. 141 (E–406), May 24, 1986.

*Primary Examiner*—Mark V. Prenty
*Attorney, Agent, or Firm*—Evenson, McKeown, Edwards & Lenahan, PLLC

[57] ABSTRACT

The disclosure relates to an amorphous silicon thin film transistor. The transistor includes a substrate, a gate electrode formed on the substrate, an insulating film formed on the substrate, a hydrogenated amorphous silicon film formed on the insulating film, a non-doped microcrystal silicon film formed on the amorphous silicon film; and source and drain electrodes which are formed on the microcrystal silicon film. In the transistor, there is provided an ohmic contact between the source and drain electrodes through the microcrystal silicon film. The insulating film optionally has an etched surface layer prepared by etching the insulating film which has been formed on the substrate, with an aqueous solution containing HF. The TFT can be produced in a simple manner with safety and with a simple equipment.

10 Claims, 1 Drawing Sheet

AMORPHOUS SILICON THIN FILM TRANSISTOR AND METHOD OF PREPARING SAME

BACKGROUND OF THE INVENTION

1. Field of the Invention

The present invention relates in general to a thin film transistor (TFT) and in particular to a TFT in which an amorphous silicon layer is used.

2. Description of the Prior Art

Recently, TFTs have been increasingly used in various fields. There have been proposed various TFTs in which $n^+$-type amorphous silicon film or $n^+$-type microcrystal silicon film is used as a semiconductor film thereof.

For example, Japanese Patent Unexamined Publication JP-A-61-59873 discloses, in FIGS. 2(c)–2(d), a TFT which is high in electron mobility and has an amorphous silicon compound semiconductor layer 14 interposed between a gate insulating layer 3 and a microcrystal silicon compound semiconductor layer 24.

JP-A-61-65477 discloses, in FIGS. 2(a)–2(d), a reverse-stagger-type TFT which is characterized in that a non-single-crystal silicon compound semiconductor is used in the semiconductor active region 4 (14'), and that an ohmic contact layer containing an n-type or p-type doped microcrystal silicon compound semiconductor layer 15 (15') is provided between the semiconductor active region and source-drain electrode metals 6, 7.

JP-A-2-47633 discloses a matrix-type liquid crystal display panel in which a TFT is used as an address device. In this TFT, an n-type microcrystal semiconductor film 7 having a conductivity of at least $10^\circ$ S/cm is used as a contact layer disposed between an amorphous silicon layer 5 and source-drain electrodes 8, 8'.

JP-A-3-23679 discloses, as shown in FIG. 1, a photoelectric transducer having a light-transmitting substrate 1, a transparent conductive film 2, a magnesium silicide layer 3, an intrinsic microcrystal silicon layer 4, an intrinsic amorphous silicon layer 5, and an electrode composed of a magnesium or magnesium compound layer 6a or a nickel or aluminum layer 6b.

JP-A-5-304171 discloses, as shown in FIG. 1, a TFT having a glass substrate 11, a gate electrode 12, a gate insulating film 13, an active layer 14 made of undoped microcrystal silicon, an ohmic contact layer 15 made of $n^+$-type amorphous silicon having a resistivity lower than that of the microcrystal silicon, and source-drain electrodes 16.

JP-B-5-50865 discloses, as shown in FIG. 2, a TFT having a semiconductor layer 4 which is made of amorphous silicon or polysilicon, and an electrode 6 which is in contact with the semiconductor layer 4. The electrode 6 is composed of a first electrode 8 which is in a direct contact with the semiconductor layer 4, and a second electrode. The first electrode 8 contains magnesium, manganese, zirconium, or a compound of one of these metals, and has a work function lower than that of the semiconductor layer 4. In this TFT, an $n^+$ layer is omitted by the provision of the first electrode 8.

In case that a $n^+$-type amorphous silicon film or $n^+$-type microcrystal silicon film is used in a TFT, it becomes necessary to add a poisonous gas of phosphine ($PH_3$) to a silane gas for doping silicon with phosphorus.

SUMMARY OF THE INVENTION

It is an object of the present invention to provide an amorphous silicon thin film transistor in which $n^+$-type layer is omitted, and in which there can be obtained a high field effect mobility and a low threshold voltage.

According to a first aspect of the present invention, there is provided an amorphous silicon thin film transistor comprising:

a substrate;

a gate electrode formed on said substrate;

an insulating film formed on said substrate;

a hydrogenated amorphous silicon film formed on said insulating film;

a non-doped microcrystal silicon film formed on said amorphous silicon film; and source and drain electrodes which are formed on said microcrystal silicon film.

According to a second aspect of the present invention, there is provided an amorphous silicon thin film transistor comprising:

a substrate;

a conductive gate electrode formed on said substrate;

a gate insulating film formed on said substrate to cover said substrate and said gate electrode said insulating film being made of $SiO_2$ and having an etched surface layer prepared by etching said insulating film which has been formed on said substrate, with an aqueous solution containing HF;

a hydrogenated amorphous silicon film formed on said etched layer of said insulating film such that said gate electrode is further covered by said amorphous silicon film;

a non-doped microcrystal silicon film formed on said amorphous silicon film such that said gate electrode is still further covered by said microcrystal silicon film; and source and drain electrodes which are formed on said microcrystal film and have a space therebetween, said space being positioned right above said gate electrode.

According to a third aspect of the present invention, there is provided a method of preparing an amorphous silicon thin film transistor, said method comprising the following steps of:

(a) forming a gate electrode on a substrate;

(b) forming an insulating film on said substrate;

(c) forming a hydrogenated amorphous silicon film on said insulating film;

(d) forming a non-doped microcrystal silicon thin film layer on said amorphous silicon film by a plasma chemical vapor deposition method using a mixture of a silane gas and a diluting gas; and (e) forming source and drain electrodes on said microcrystal silicon film layer.

According to a fourth aspect of the present invention, there is provided a method of preparing an amorphous silicon thin film transistor, said method comprising the following steps of:

(a) forming a gate electrode on a substrate, (b) forming an insulating film on said substrate so as to fully cover said gate electrode;

(c) etching said insulating film with an aqueous solution containing hydrogen fluoride to form thereon an etched surface;

(d) forming a hydrogenated amorphous silicon film on said etched surface, so as to further fully cover said gate electrode;

(e) forming a non-doped microcrystal silicon thin film layer on said amorphous silicon film by a plasma chemical vapor deposition method using a mixture of a silane gas and a diluting gas, so as to still further fully cover said gate electrode; and (f) forming source and drain electrodes on said microcrystal silicon film layer such that a space defined between said source and drain electrodes is positioned right above said gate electrode.

According to the present invention, a non-doped microcrystal silicon thin film layer unexpectedly becomes high in conductivity by disposing the non-doped microcrystal silicon thin film layer between the source and drain electrodes and a hydrogenated amorphous silicon film. With this, there is provided an ohmic contact between source-drain electrodes through the non-doped microcrystal silicon thin film. Thus, an $n^+$-type layer is omitted in a TFT according to the present invention. With this, the TFT can be produced in a simpler manner with more safety and with a simpler equipment. In the TFT, there can be obtained a high field effect mobility (e.g., about 1.2 to about 1.5 $cm^2/Vs$) and a low threshold voltage (e.g., less than about 5 V).

A TFT according to the present invention contributes to the fineness and brightness of liquid crystal display (LCD) and particularly those of color LCD. The TFT further enhances the possibility to diminish the TFT in size. Thus, according to he present invention, there is provided a TFT which is efficiently usable as various switching devices (e.g., active matrix type LCD) and as charge-transfer type devices (e.g., solid-state image sensing device of a video camera and an image sensor of copy machine).

DESCRIPTION OF THE PREFERRED EMBODIMENTS

Figure 1:
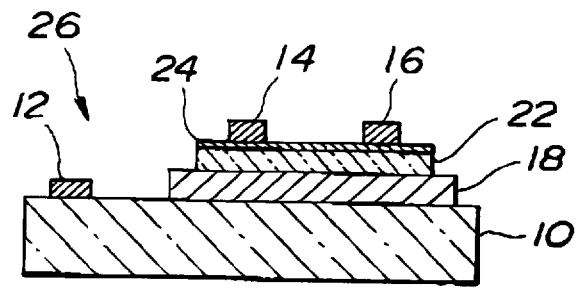
FIG. 1 is an elevational and sectional view, showing a TFT according to a first embodiment of the present invention.
Figure 2:
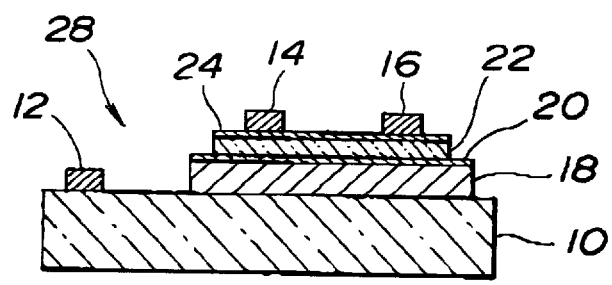
FIG. 2 is a view similar to FIG. 1, but showing a TFT having an etched surface layer prepared by etching an insulating film, according to a second embodiment of the present invention.
Figure 3:
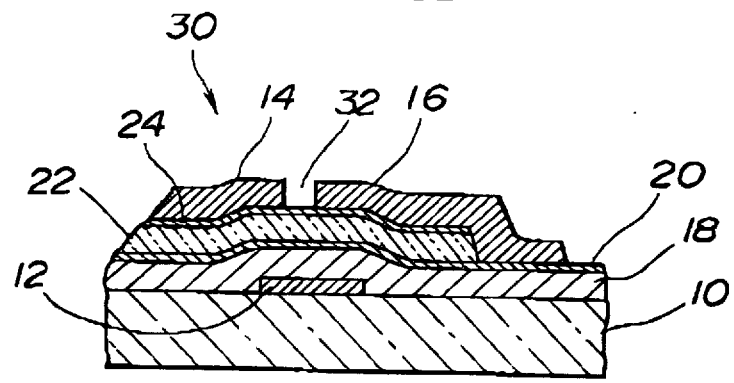
FIG. 3 is a view similar to FIG. 2, but showing a TFT according to a third embodiment of the present invention.

Referring to FIGS. 1–3, a TFT (thin film transistor) according to the present invention will be described in detail in the following.

In the invention, a substrate 10, which is shown in FIGS. 1–3, is not limited to a particular material. A suitable substrate is selected depending on the use of TFT. Examples of the substrate are glass substrates made of soda-lime glass, borosilicate glass, no-alkali glass and the like, float glass substrate having insulated surface, quartz substrate, silicon wafer, and the like. Of these, it is economically preferable to use a soda-lime glass substrate. Furthermore, it is preferable to use a no-alkali glass or quarts substrate, in case that a high-quality TFT is required. Such TFT requires no inclusion of alkali components that may be an obstacle, for example, to display fineness and brightness of LCD. It is preferable to use a borosilicate glass substrate or a float glass substrate having an insulated surface, in case that a medium-quality TFT is required. Silicon wafer is used in case that a conductive substrate is permitted.

In the invention, a gate electrode 12, which is shown in FIGS. 1–3, is formed on the substrate 10 by deposition or the like. The gate electrode 12 is a metal film made of Al, Cr, Mo, Ta, Zr, Mg, Mn, Ti, Ni or the like, a metal alloy film made of at least two of these metals, or a multilayered film composed of at least two of these metal and metal alloy films. Each of source and drain electrodes 14, 16, which are shown in FIGS. 1–3, is formed on the aftermentioned non-doped microcrystal silicon film by deposition or the like, using a stainless steel mask. Each of these electrodes is a metal film made of Al, Cr, Ti, Mo, Zr, Mg, Mn, Ta or the like, a metal alloy film made of at least two of these metals, or a multilayered film composed of at least two of these metal and metal alloy films. Each of the gate, source and electrodes 12, 14, 16 has a thickness preferably from about 10 nm to about 400 nm and more preferably from about 50 nm to about 300 nm, and its shape and size is varied depending on use.

In the invention, an insulating film 18, which is shown in FIGS. 1–3 may be made of $SiO_2$, $SiN_x$, $Ta_2O_5$, or the like. The insulating film made of $SiO_2$ may be formed on the substrate by the dry oxidation method or the plasma chemical vapor deposition (CVD) method. In the dry oxidation method, the insulating film is formed on the substrate by at first putting the substrate into a high-temperature oxidation furnace heated at a temperature from about 400° to 1,200° C. and then blowing Si gas and a high-purity oxygen gas into the furnace. In the plasma CVD method, $SiH_4$ gas and $N_2O$ gas are used as main raw materials. The thickness of the insulating film 18 varies depending on its components, its composition, its required insulation, and the types of other films used in the TFT. The insulating film 13 has a thickness, for example, from about 5 to about 500 nm and preferably from about 100 to about 400 nm, and more preferably from about 140 to about 300 nm.

As shown in FIGS. 2–3, according to the second and third embodiments of the present invention, an etched surface 20 is formed on the insulating film 18 by treating the insulating film 18 with an aqueous solution containing HF, for the purpose of removing stains and impurities from the insulating film's surface, of making the insulating film surface rich in Si, of causing a terminational behavior of $H_2$, and of the like. "The terminational behavior of $H_2$" refers to that the insulating film 18 is covered with hydrogen caused by the etching treatment, and that this hydrogen serves as a protective film against oxidation and impurities. This particular etched surface 20 contributes to a high field-effect mobility. The etched surface 20 has a thickness, for example, from about 1 to about 30 nm and preferably from about 2 nm to about 20 nm. It is preferable that the above-mentioned aqueous solution further contains $NH_4F$, for the purpose of adjusting pH thereof and the degree of etching of the insulating film 18. The HF concentration of the aqueous solution is preferably within a range from a first concentration with which the insulating film can be etched, to a second concentration which is less than 10%. The aqueous solution has a volumetric ratio of HF to $NH_4F$ preferably within a first range from 10:100 to 15:100 and more preferably within a second range from 11:100 to 13:100. If it is outside the first range, it may become difficult to stably adjust the HF concentration and pH of the aqueous solution. With this, the etched surface 20 may not contribute to a high field-effect mobility.

In the invention, a hydrogenated amorphous silicon film 22, which is shown in FIGS. 1–3, is formed, for example, by the radio-frequency plasma-enhanced chemical vapor deposition (RF-PECVD) method. In this method, it is important to optimize conditions for forming this film, such as deposition rate, pressure, baking temperature, degree of vacuum, silane gas flow rate, the substrate temperature, and the like. When the film is formed by RF-PECVD method, the baking temperature is adjusted, for example at about 400° C.; the vacuum is adjusted, for example, within a range of from about $0.2 \times 10^{-7}$ to about $1.0 \times 10^{-7}$ Torr, by removing the atmosphere with a turbo pump; the pressure is adjusted at about 30 mTorr; the radio frequency power is adjusted, for example, within a range from about 1 to about 5 W; the substrate temperature is adjusted, for example, within a range from about 100° to about 340° C. and preferably within a range from about 200° to about 300° C.; the flow rate of silane gas is adjusted, for example, at about 5 sccm, the deposition rate is adjusted, for example, within a range from about 0.06 to about 0.07 nm/sec. The above-mentioned range of vacuum leads to a cleanness having a defect density (Nd) (i.e., the number of dangling bonds per unit volume), for example, on the order of from $10^{14}$ to $10^{15}$ cm$^{-3}$. The hydrogenated amorphous silicon thin film has a thickness preferably from about 50 to about 500 nm to obtain a high field-effect mobility, and more preferably from about 100 to about 400 nm to assuredly obtain a high field-effect mobility.

In the invention, a non-doped microcrystal (microcrystalline) silicon thin film 24, which is shown in FIGS. 1–3, may be formed by triode method or diode method. Of these, triode method is preferably used. When this film is formed, for example, by the radio-frequency plasma-enhanced chemical vapor deposition (RF-PECVD) method, it is important to optimize conditions for forming the film, such as deposition rate, pressure, baking temperature, degree of vacuum, silane gas flow rate, and the like. When the film is formed by RF-PECVD method, the pressure is adjusted, for example, within a range from about 30 to 100 mTorr and preferably within a range from about 40 to about 70 mTorr; the radio frequency power is adjusted, for example, within a range from about 5 to about 20 W and preferably within a range from about 8 to about 15 W; the substrate temperature is adjusted, for example, within a range from about 100° to about 340° C. and preferably within a range from about 200° to about 300° C.; the flow rate ratio of silane gas to H$_2$ gas is adjusted, for example, within a range from about 1:70 to about 1:14 sccm and preferably within a range from about 1:55 to about 1:30 sccm; the deposition rate is adjusted, for example, within a range from about 0.005 to about 0.07 nm/sec. and preferably from about 0.008 to about 0.03 nm/sec. The non-doped microcrystal silicon thin film has a thickness preferably from about 10 to about 100 nm to obtain a high field-effect mobility, and more preferably from about 30 to about 70 nm in consideration of threshold voltage.

As stated above, during the formation of the hydrogenated amorphous silicon film 22 and of the non-doped microcrystal silicon thin film 24, the substrate temperature is adjusted, for example, within a range from about 100° to about 340° C., and preferably within a range from about 200° to about 300° C. With this, for example, there are obtained a field effect mobility as high as a range from about 1.2 to about 1.5 cm$^2$/Vs and a threshold voltage as low as or lower than about 5 V.

In case that the hydrogenated amorphous silicon thin film 22 and the non-doped microcrystal silicon thin film 24 are formed by a vapor deposition method, a silane gas (e.g., monosilane gas, disilane gas and chlorine-containing silane gas) is used as a raw material for forming these films. A diluting gas to be mixed with the silane gas is H$_2$ gas, argon gas, xenon gas or the like. The mixing ratio of the diluting gas to the silane gas is preferably from about 14:1 to about 70:1. If it is less than 14:1, the occurrence of silicon microcrystals may decrease too much. With this, the values of mobility and threshold voltage may not become satisfactory. Thus, it may become necessary to provide n$^+$ layer for obtaining ohmic contact. If it is greater than 70:1, the deposition rate may become too slow. The hydrogenated amorphous silicon film 22 and the non-doped microcrystal silicon thin film 24 may be formed by sputtering method, heat CVD method, catalyst CVD method or the like, as well as RF-PECVD method as stated above.

In the invention, the TFT is optionally subjected to annealing at a temperature from 170° to 190° C. With this, for example, there is provided a good ohmic contact (nonrectifying) between an aluminum metal film which is under a condition immediately after the deposition thereof and the non-doped microcrystal silicon thin film. Therefore, desired certain characteristics of the TFT are obtained. The annealing and the above-mentioned etching of the insulating film 18 bring an advantageous synergistic effect on field-effect mobility. If the annealing temperature is lower than 170° C., the annealing may not contribute so much to a high field-effect mobility. If it is higher than 190° C., the annealing may bring an adverse effect on other films used in the TFT and may not contribute so much to a high-field effect mobility.

EXAMPLE 1

This example is nonlimitative and illustrative of the first embodiment of the present invention. A TFT 24 shown in FIG. 1 was prepared as follows.

At first, a silicon wafer 10 having a size of about 6 cm$^2$, as a substrate, was put into a high temperature oxidation furnace heated at about 1,000° C. (usually a range from about 800° to 1200° C. is permissible). Then, silicon gas and a high-purity oxygen gas were blown into the furnace, thereby to form, on the substrate 10, an insulating film 18 which is made of SiO$_2$ and has a thickness of about 150 nm.

Then, a hydrogenated amorphous silicon thin film 22 was formed on the insulating film 18 by a RF-PECVD method, as follows. At first, the substrate having thereon the insulating film was put into a CVD oven. The baking temperature of this oven was adjusted to about 400° C., and its atmosphere was removed by a turbo pump to obtain a vacuum of from about $0.2 \times 10^{-7}$ to $1.0 \times 10^{-7}$ Torr. Then, SiH$_4$ gas was allowed to flow into the oven with a flow rate of about 5 sccm, under conditions of an oven pressure of about 30 mTorr, a RF power of 20 W, a substrate temperature of about 250° C. and a D. C. bias voltage of about −30 V, thereby to form a hydrogenated amorphous silicon thin film 22 having a total thickness of about 250 nm with a deposition rate of from about 0.06 to about 0.07 nm/sec.

Then, a non-doped microcrystal silicon thin film 24 was formed on the amorphous silicon thin film 22, in the same CVD oven as above, by a RF-PECVD method, as follows. SiH$_4$ and H$_2$ gases were allowed to flow into the oven with flow rates of about 1 and about 49 sccm respectively, under conditions of an oven pressure of about 50 mTorr, a RF power of 10 W, a substrate temperature of about 250° C. and a D. C. bias voltage of about −50 V, thereby to form a non-doped microcrystal silicon thin film 24 having a total thickness of about 50 mm with a deposition rate of about 0.01 nm/sec. The thus obtained silicon thin film 24 had a crystal size as fine as about 20 nm, which size is different from that of polycrystal.

Then, the thus coated substrate was cooled down and then taken out from the oven. After that, the coated substrate was set in a deposition equipment. Then, an aluminum metal film having a thickness of about 150 nm as a gate electrode 12 was formed on the substrate 10, and aluminum metal films having a thickness of about 200 nm as source and drain electrodes 14, 16 were formed on the microcrystal silicon thin film 22, using a stainless steel mask, thereby to obtain a microcrystal silicon TFT 26.

A plurality of samples of the thus obtained TFT 26 were subjected to tests for determining mobility and threshold voltage, using a Semiconductor Parameter Analyzer of Yokokawa Hewlett Packard Co. With this, mobility ($\mu$) was found to be in a range from about 1.2 to about 1.5 cm$^2$/Vs, and the threshold voltage was found to be in a range from about 3 to about 5 V.

EXAMPLE 2

This example is nonlimitative and illustrative of the second embodiment of the present invention. A TFT 28 shown in FIG. 2 was prepared as follows.

In this example, Example 1 was repeated except in that the insulating film 18 was subjected to the following etching treatment, prior to the formation of the amorphous silicon thin film 22.

In fact, the insulating film 18 was formed on the substrate 10 in the same manner as that of Example 1. In the etching treatment, at first, an aqueous solution mixture was prepared by mixing about 12 parts by volume of a 50% HF aqueous solution with about 100 parts by volume of a 40% NH$_4$F aqueous solution. Then, the substrate having thereon the insulating film 18 was immersed in the aqueous solution mixture for about 10 sec, to obtain an etched surface layer 20 having a thickness of from about 1 to about 20 nm. Then, the coated substrate was washed with pure water, then treated with ethanol to remove water, and then dried. After that, the amorphous silicon thin film 22, the microcrystal silicon thin film 24, and the gate, source and drain electrodes 12, 14, 16 were formed in the same manners as those of Example 1.

A plurality of samples of the thus obtained TFT 28 were subjected to the same determinations as those of Example 1. With this, the results of both of mobility and voltage threshold were satisfactory as those of Example 1, but had smaller deviations than those of the results of Example 1. It is considered that the removal of impurities and the like on the insulating film by the etching treatment contributed to the results of smaller deviations.

EXAMPLE 3

This example is nonlimitative and illustrative of the third embodiment of the present invention. A TFT 30 shown in FIG. 3 was prepared as follows.

In this example, Example 2 was slightly modified as follows. At first, a gate electrode 12 was formed on a substrate 10 in the same manner as that of Example 2. Then, an insulating film 18 was formed on the substrate 10 so as to fully cover the gate electrode 12, as shown in FIG. 3. Then, the insulating film 18 was subjected to an etching treatment in the same manner as that of Example 2, to form an etched surface layer 20. Then, an amorphous silicon thin film 22 was formed on the etched surface layer 20 in the same manner as that of Example 2, so as to further fully cover the gate electrode 12, as shown in FIG. 3. Then, a non-doped microcrystal silicon thin film 24 was formed on the amorphous silicon thin film 22 in the same manner as that of Example 2, so as to still further fully cover the gate electrode 12, as shown in FIG. 3. Then, source and drain electrodes 14, 16 were formed on the microcrystal silicon thin film 24 in the same manner as that of Example 2, so as to make a space 32 defined between the source and drain electrodes 14, 16 to be positioned right above the gate electrode 12, as shown in FIG. 3.

A plurality of samples of the thus obtained TFT 30 were subjected to the same determinations as those of Example 1. With this, the results of both of mobility and voltage threshold were satisfactory as those of Example 2.

The TFTs shown in FIGS. 1–3 are of reverse-stagger type. The present invention is, however, applicable to coplanar type TFTs, too.

What is claimed is:

1. An amorphous silicon thin film transistor comprising:
   a substrate;
   a gate electrode formed on said substrate;
   an insulating film formed on said substrate;
   a hydrogenated amorphous silicon film formed on said insulating film;
   a non-doped microcrystal silicon film formed on said amorphous silicon film; and
   source and drain electrodes which are formed on said microcrystal silicon film,
   wherein said amorphous silicon film and said microcrystal silicon film are formed on said insulating film by a method comprising sequential steps of:
   (a) putting a laminate of said substrate and said insulating film into an oven;
   (b) removing an atmosphere of said oven to produce a vacuum of from about $0.2 \times 10^{-7}$ to $1.0 \times 10^{-7}$ Torr;
   (c) allowing a silane gas to flow into said oven having said vacuum, while said substrate is heated within a temperature range of from about 100° to about 340° C., so as to form said amorphous silicon film on said insulating film; and
   (d) allowing a mixture of a silane gas and a diluting gas to flow into said oven, while said substrate is heated within a temperature range of from about 100° to about 340° C., so as to form said microcrystal silicon film on said amorphous silicon film.

2. A transistor according to claim 1, wherein said insulating film has an etched surface layer prepared by etching said insulating film which has been formed on said substrate, with an aqueous solution containing HF, and thus said etched surface layer is in a direct contact with said amorphous silicon film.

3. A transistor according to claim 1, wherein said insulating film is made of SiO$_2$ or SiN$_x$.

4. A transistor according to claim 2, wherein said aqueous solution further contains NH$_4$F.

5. A transistor according to claim 4, wherein the volumetric ratio of HF to NH$_4$F is in a range of from 10:100 to 15:100.

6. An amorphous silicon thin film transistor comprising:
   a substrate;
   a conductive gate electrode formed on said substrate;
   a gate insulating film formed on said substrate to cover said substrate and said gate electrode, said insulating film being made of SiO$_2$ and having an etched surface layer prepared by etching said insulating film, which has been formed on said substrate, with an aqueous solution containing HF;
   a hydrogenated amorphous silicon film formed on said etched layer of said insulating film such that said gate electrode is further covered by said amorphous silicon film;

a non-doped microcrystal silicon film formed on said amorphous silicon film such that said gate electrode is still further covered by said microcrystal silicon film; and source and drain electrodes which are formed on said microcrystal film and have a space therebetween, said space being positioned right above said gate electrode, wherein said amorphous silicon film and said microcrystal silicon film are formed on said insulating film by a method comprising sequential steps of:
- (a) putting a laminate of said substrate, said gate electrode and said insulting film into an oven;
- (b) removing an atmosphere of said oven to produce a vacuum of from about $0.2 \times 10^{-7}$ to $1.0 \times 10^{-7}$ Torr;
- (c) allowing a silane gas to flow into said oven having said vacuum, while said substrate is heated within a temperature range of from about 100° to about 340° C., so as to form said amorphous silicon film on said insulating film; and
- (d) allowing a mixture of a silane gas and a diluting gas to flow into said oven, while said substrate is heated within a temperature range of from about 100° to about 340° C., so as to form said microcrystal silicon film on said amorphous silicon film.

7. A transistor according to claim 6, wherein said insulating film is made of $SiO_2$ or $SiN_x$.

8. A transistor according to claim 6, wherein said aqueous solution further contains $NH_4F$.

9. A transistor according to claim 8, wherein the volumetric ratio of HF to $NH_4F$ is in a range of from 10:100 to 15:100.

10. An amorphous silicon thin film transistor comprising:

a substrate;

a gate electrode formed on said substrate;

an insulating film formed on said substrate;

a hydrogenated amorphous silicon film formed on said insulating film;

a non-doped microcrystal silicon film formed on said amorphous silicon film; and source and drain electrodes which are formed on said microcrystal silicon film;

wherein said insulting film has an etched surface layer prepared by etching said insulating film, which has been formed on said substrate, with an aqueous solution containing HF so that said etched surface layer is in a direct contact with said amorphous silicon film, and said amorphous silicon film and said microcrystal silicon film are formed on said insulating film by a method comprising sequential steps of:
- (a) putting a laminate of said substrate and said insulating film into an oven;
- (b) removing an atmosphere of said oven to produce a vacuum of from about $0.2 \times 10^{-7}$ to $1.0 \times 10^{-7}$ Torr;
- (c) allowing a silane gas to flow into said oven having said vacuum, while said substrate is heated within a temperature range of from about 100° to about 340° C. so as to form said amorphous silicon film on said insulating film; and
- (d) allowing a mixture of a silane gas and a diluting gas to flow into said oven, while said substrate is heated within a temperature range of from about 100° to about 340° C. so as to form said microcrystal silicon film on said amorphous silicon film.

* * * * *